United States Patent
Ryoo et al.

(10) Patent No.: US 9,406,361 B2
(45) Date of Patent: Aug. 2, 2016

(54) LOW LATENCY, HIGH BANDWIDTH MEMORY SUBSYSTEM INCORPORATING DIE-STACKED DRAM

(71) Applicant: Oracle International Corporation, Redwood City, CA (US)

(72) Inventors: Jee Ho Ryoo, Austin, TX (US); Karthik Ganesan, Austin, TX (US); Yao-Min Chen, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 106 days.

(21) Appl. No.: 14/227,041

(22) Filed: Mar. 27, 2014

(65) Prior Publication Data

US 2015/0279436 A1    Oct. 1, 2015

(51) Int. Cl.
| G06F 12/00 | (2006.01) |
| G11C 8/06 | (2006.01) |
| G11C 5/04 | (2006.01) |
| G11C 8/12 | (2006.01) |

(52) U.S. Cl.
CPC .. G11C 8/06 (2013.01); G11C 5/04 (2013.01); G11C 8/12 (2013.01)

(58) Field of Classification Search
CPC .................................. G11C 8/06; G11C 8/12
USPC .......................................... 711/103, 105, 170
See application file for complete search history.

(56) References Cited

U.S. PATENT DOCUMENTS

| 7,852,690 | B2* | 12/2010 | Cornwell | G11C 11/5621 365/149 |
| 8,709,871 | B2 | 4/2014 | Yamada et al. | |
| 8,737,108 | B2 | 5/2014 | Saraswat et al. | |
| 8,787,060 | B2 | 7/2014 | Lee | |
| 8,868,843 | B2* | 10/2014 | Loh | G06F 12/0888 711/138 |
| 8,897,053 | B1* | 11/2014 | Stephens, Jr. | G11C 11/40615 365/193 |
| 8,930,647 | B1* | 1/2015 | Smith | G06F 9/44557 711/103 |
| 2014/0181387 | A1* | 6/2014 | Poremba | G11C 7/1072 711/105 |

OTHER PUBLICATIONS

Chen et al, "CACTI-3DD: Architecture-level Modeling for 3D Die-stacked DRAM Main Memory", Design, Automation & Test in Europe Conference & Exhibition, 2012.*

* cited by examiner

*Primary Examiner* — Pierre-Michel Bataille
(74) *Attorney, Agent, or Firm* — Meyertons Hood Kivlin Kowert & Goetzel; Erik A. Heter (57) ABSTRACT

A memory subsystem incorporating a die-stacked DRAM (DSDRAM) is disclosed. In one embodiment, a system include a processor implemented on a silicon interposer of an integrated circuit (IC) package, a DSDRAM coupled to the processor, the DSDRAM implemented on the silicon interposer of the IC package, and a DRAM implemented separately from the IC package. The DSDRAM and the DRAM form a main memory having a contiguous address space comprising a range of physical addresses. The physical addresses of the DSDRAM occupy a first contiguous portion of the address space, while the DRAM occupies a second contiguous portion of the address space. Each physical address of the contiguous address space is augmented with a first bit that, when set, indicates that a page is stored in the DRAM and the DSDRAM.

15 Claims, 9 Drawing Sheets

LOW LATENCY, HIGH BANDWIDTH MEMORY SUBSYSTEM INCORPORATING DIE-STACKED DRAM

BACKGROUND

1. Technical Field

This disclosure relates to computer systems, and more particularly, memory subsystems.

2. Description of the Related Art

Computer systems typically include a main memory implemented on one or more integrated circuits (ICs) separate from a processor. The main memory in many systems is implemented using dynamic random access memory. The processor may access the memory for data and instructions during operations. Many modern processors include one or more processor cores, each of which may include its own execution units, registers, and so on.

To improve performance a processor may implement one or more levels of cache memory in each of its one or more cores. A cache memory may store frequently accessed data and/or instructions in an on-chip memory closer to execution units of the processor. Caches may be implemented in multiple levels, e.g., Level One (L1), L2, L3, etc. An L1 cache may be the closest cache to an execution unit in a processor, and L2 may be the next level, and so forth. In some cases, such as with L1 caches, separate caches may be provided for instructions and data.

Cache subsystems are hardware based systems. That is, a cache subsystem may be transparent to an operating system (OS) or other software executing on a processor core. In addition to storing data, a cache may also store extra information, such as a tag, to identify cache lines. A tag may include a certain number of bits. Generally speaking, for a given cache line size, the larger the cache (and thus, the greater number of cache lines), the greater number of bits used in the tag.

SUMMARY OF THE DISCLOSURE

A memory subsystem incorporating a die-stacked DRAM (DSDRAM) is disclosed. In one embodiment, a system include a processor implemented on a silicon interposer of an integrated circuit (IC) package, a DSDRAM coupled to the processor, the DSDRAM implemented on the silicon interposer of the IC package, and a DRAM implemented separately from the IC package. The DSDRAM and the DRAM form a main memory having a contiguous address space comprising a range of physical addresses. The physical addresses of the DSDRAM occupy a first contiguous portion of the address space, while the DRAM occupies a second contiguous portion of the address space. Each physical address (PA) has unused bits, e.g., the most significant bits in a 64-bit physical address, that are not used in the indexing of physical memory location. One such bit, when set, indicates that the corresponding page is stored in both the DRAM and the DSDRAM.

In one embodiment, a method includes storing memory pages determined to be infrequently accessed in a first portion of an address space of a system memory in a computer system, the address space comprising a contiguous range of addresses. The method further comprises storing memory pages determined to be frequently accessed in both the first portion and a second portion of the address space, wherein the first portion of the address space is implemented in one or more dynamic random access memory (DRAM) chips separate from an integrated circuit (IC) package that includes a processor, and wherein the second portion of the address space is implemented on a silicon substrate of the IC package using a die-stacked DRAM (DSDRAM). Each physical address (PA) has unused bits, e.g., the most significant bits in a 64-bit physical address, that are not used in the indexing of physical memory location. One such bit, when set, indicates that the corresponding page is stored in both the DRAM and the DSDRAM.

BRIEF DESCRIPTION OF THE DRAWINGS

Other aspects of the disclosure will become apparent upon reading the following detailed description and upon reference to the accompanying drawings which are now described as follows.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Figure 1:
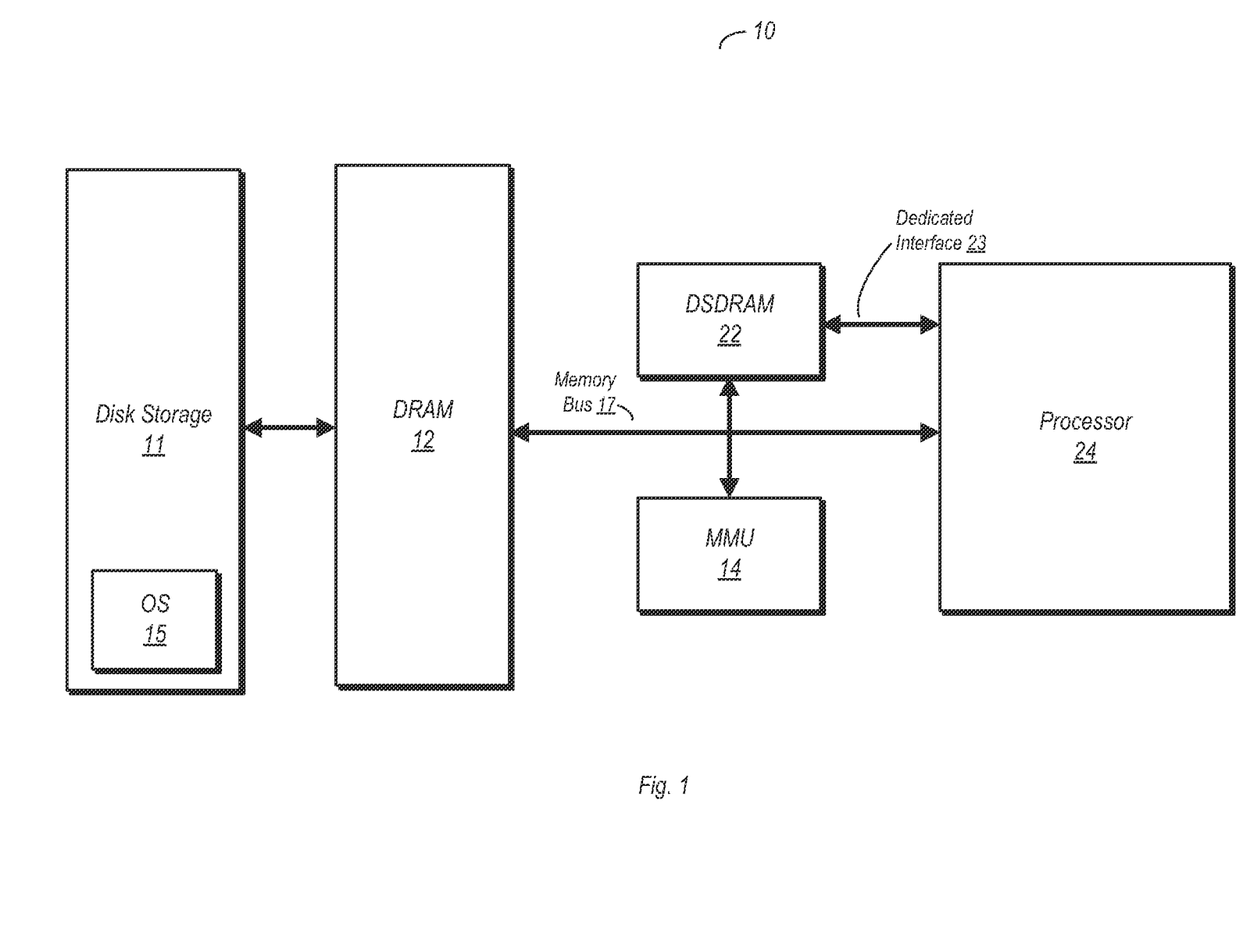
FIG. 1 is a block diagram of one embodiment of a computer system.

FIG. 1 is a block diagram of one embodiment of a computer system. In the embodiment shown, computer system 10 includes disk storage 11, a dynamic random access memory (DRAM) 12, die-stacked DRAM (DSDRAM) 22, a memory management unit 14, and a processor 24. Memory bus 17 couples DRAM 12, MMU 14, DSDRAM 22, and processor 24 to one another. Additionally, a dedicated interface 23 is implemented between DSDRAM 22 and processor 24.

Disk storage 11 in the embodiment shown is configured to provide non-volatile bulks storage for programs and data to be utilized by computer system 10. Among the programs stored on disk storage 11 is an operating system (OS) 15, which performs various functions such as managing the hardware on computer system 10 during operation. OS 15 or portions thereof may be loaded into main memory during operation.

The main memory of computer system is comprised by both DRAM 12 and DSDRAM 22. DRAM 12 and DSDRAM 22 are part of a contiguous address space, with DSDRAM 22 occupying a first portion while DRAM 12 occupies a second portion. Since both DRAM 12 and DSDRAM 22 are part of the same main memory address space, pages may be allocated to locations in both by OS 15. As will be discussed below, DSDRAM 22 may be used to mirror certain pages that are also stored in DRAM and are more frequently accessed. However, unlike a conventional cache subsystem, the use of DSDRAM 22 to store frequently accessed pages may be controlled at least in part by OS 15 instead of being entirely hardware based. Another distinction between the use of DSDRAM 22 discussed herein and a conventional cache subsystem is that no tags or other overhead normally associated with a cache (e.g., dirty bits, etc.) are required, in part due to OS 15 controlling the allocation of pages in the main memory address space. It is further noted that DSDRAM 22 is fully associative, whereas a majority of cache subsystems are not.

Pages that are mirrored in DSDRAM 22 may be accessed by software executing on processor 24 via dedicated interface 23 at much lower latency than from DRAM. Dedicated interface 23 may be a high speed interface between DSDRAM 22 and processor 24 that is dedicated solely to transfers therebetween.

The principle behind the use of DSDRAM 22 may be explained as follows. During the execution of programs by processor 24, a certain percentage of memory accesses (e.g., 80%) may occur within a certain portion of the main memory address space (e.g., 2 GB). Accordingly, DSDRAM 22 may be sized in such a manner as to mirror the portion of the address space that accounts for the large majority of memory accesses. This may in turn reduce the memory access latency for a majority of memory accesses, particularly when accesses are performed via dedicated interface 23. Furthermore, for data/instructions not located in one of the cache memories in processor 24, utilization of DSDRAM 22 and dedicated interface 23 may reduce the miss penalty that might otherwise occur if the information has to be read from DRAM 12.

Figure 2:
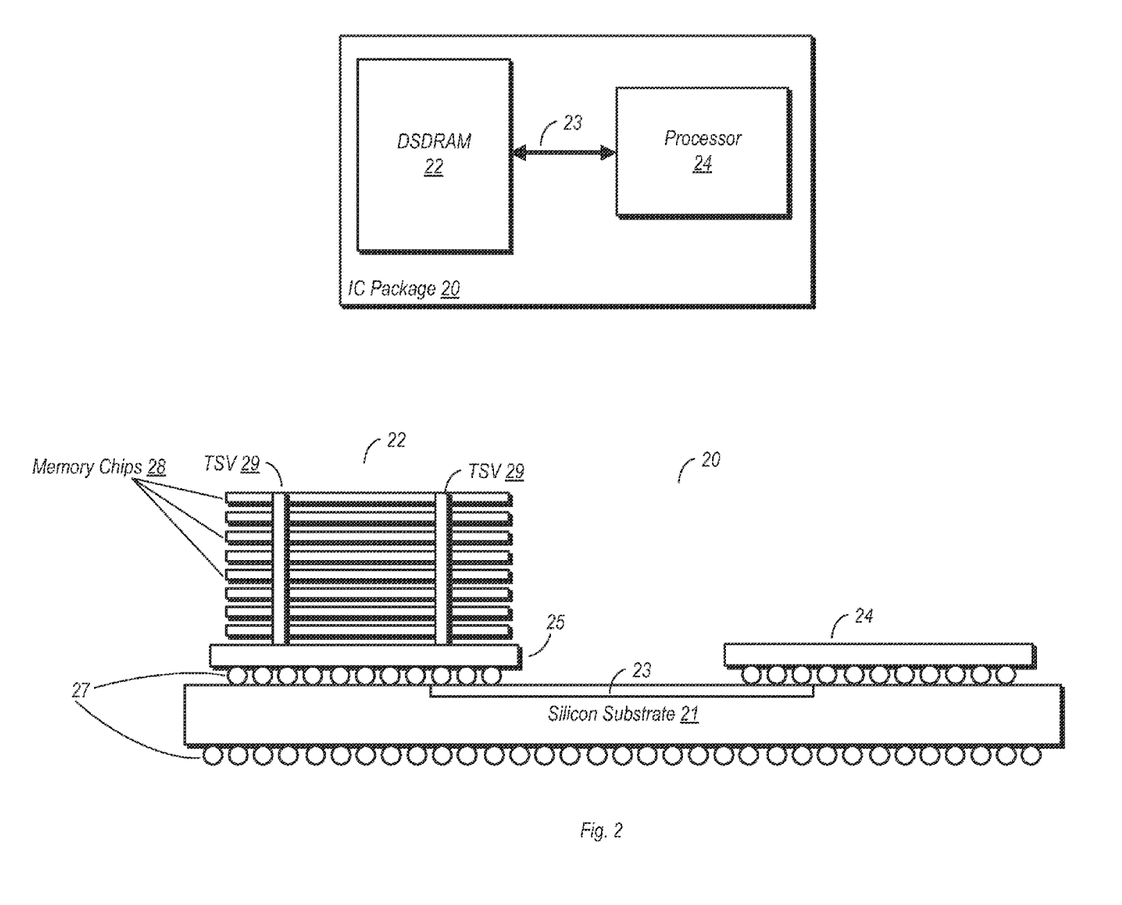
FIG. 2 includes top and side views of one embodiment of an IC package having a processor and a DSDRAM mounted on a silicon substrate.

Turning now to FIG. 2, top and side views of one embodiment of an integrated circuit (IC) package 20 that includes processor 24 and DSDRAM 22. Processor 24 and DSDRAM 22 are both attached to a silicon substrate 21 of IC package 20 by ball grid array (BGA) connections in the embodiment shown, each of which comprises a number of solder balls 27. Similarly, silicon substrate 21 may also include solder balls forming a BGA connection to a system board (not shown here). It is noted however that the connections (which may be physical and electrical) may be implemented using other attachment techniques. Dedicated interface 23 in the embodiment shown is implemented within silicon substrate 21 between DSDRAM 22 and processor 24, and may include a number of signal paths to support the transfer of information and control signals.

DSDRAM 22 in the embodiment shown includes a number memory chips 28 arranged in a stacked configuration. The memory chips 28 are electrically and physically coupled to one another, as well as to substrate 25, by through silicon vias (TSVs) 29, two of which are shown here for the sake of illustration. Additional logic (e.g., address selection, write/read enables, etc.) of DSDRAM 22 may be implemented within substrate 25, which may also be a silicon substrate. The TSVs 29 may provide a high speed connection between the logic portions of DSDRAM 22 and the storage locations on the memory chips 28. Furthermore, the TSVs 29 may also provide a high bandwidth connection for conveying data between the memory chips and the high-speed dedicated interface 23.

Figure 3:
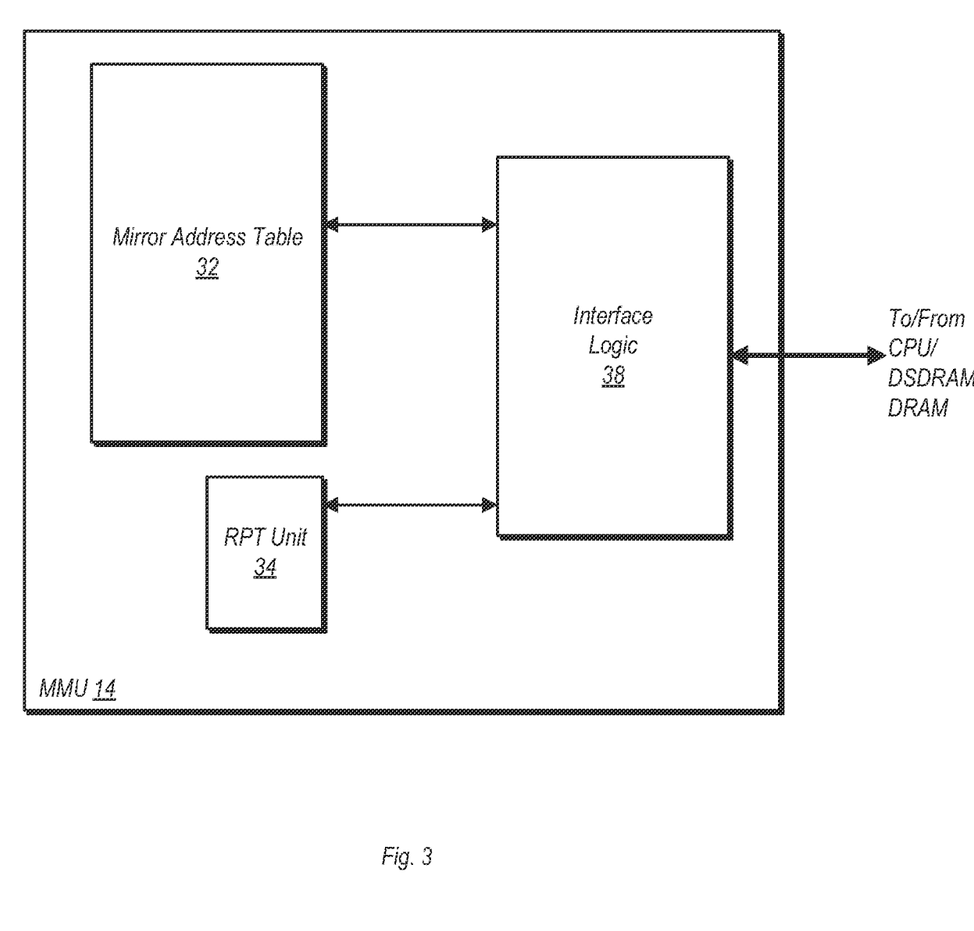
FIG. 3 is a block diagram of a memory controller including a mirror address table and a reverse promotion table.

FIG. 3 is a block diagram of an embodiment of MMU 14. In the embodiment shown, MMU 14 includes interface logic 38, mirror address table (MAT) 32, and reverse promotion table (RPT) unit 34. It is noted that this is a simplified block diagram, and MMU 14 may include other logic units for controlling the movement of data to and from memory, such as direct memory access (DMA) logic.

MAT 32 in the embodiment shown is configured to store information regarding pages that are stored in DRAM 12 and also mirrored in DSDRAM 22. In particular, MAT 32 is configured to store physical DRAM addresses of pages that are also mirrored (stored) in DSDRAM 22. Additionally, for each physical DRAM address stored, MAT 32 also stores a corresponding physical address in DSDRAM where the page corresponding to the DRAM address is stored. When a physical DRAM address is provided for a memory read request, OS 15 may cause the address to be provided to DRAM 12 as well as to MAT 32. If the physical address is located in MAT 32, the page corresponding to the physical DRAM address may be read from DSDRAM 22. If the memory request is a write request, the information may be written to DRAM 12, and may also be written into a mirrored location if MAT 32 indicates the page is stored in DSDRAM 22. Thus, DSDRAM 22 may act as a write-through memory during writes.

When a new page is initially the target of an access request, OS 15 may allocate the page to a location in DSDRAM 22. If the page has not already been allocated to DRAM, OS 15 may perform this function as well. In allocating pages to DSDRAM, OS 15 may also choose pages to de-allocate from DSDRAM and cause these pages to be evicted therefrom. Various algorithms may be used in different embodiments to determine which pages are to be evicted from DSDRAM 22, such as a least recently used (LRU) or least frequently used (LFU). When a page is evicted from DSDRAM 22, its corresponding physical DRAM address may be recorded in an RPT of RPT unit 34.

RPT unit 34 in the embodiment shown is configured to store physical DRAM addresses for a limited number of pages that have recently been evicted from DSDRAM 22. The RPT within RPT unit 34 may be used as a check on the page replacement process in DSDRAM 22 by indicating whether a page corresponding to a physical DRAM address stored therein may have been prematurely evicted from DSDRAM 22. When a page is evicted from DSDRAM 22, its physical DRAM address may be written into the RPT of RPT unit 34. If the page is subsequently the target of an access request, the page is not immediately returned to DSDRAM 22, but the access request is recorded by logic in RPT unit 34. If an evicted page is accessed frequently enough, it may eventually be promoted back into DSDRAM 22. Otherwise, if an evicted page is not accessed or is accessed infrequently, it is not promoted back into DSDRAM 22, and eventually its corresponding physical DRAM address will be evicted from the RPT.

Figure 4:
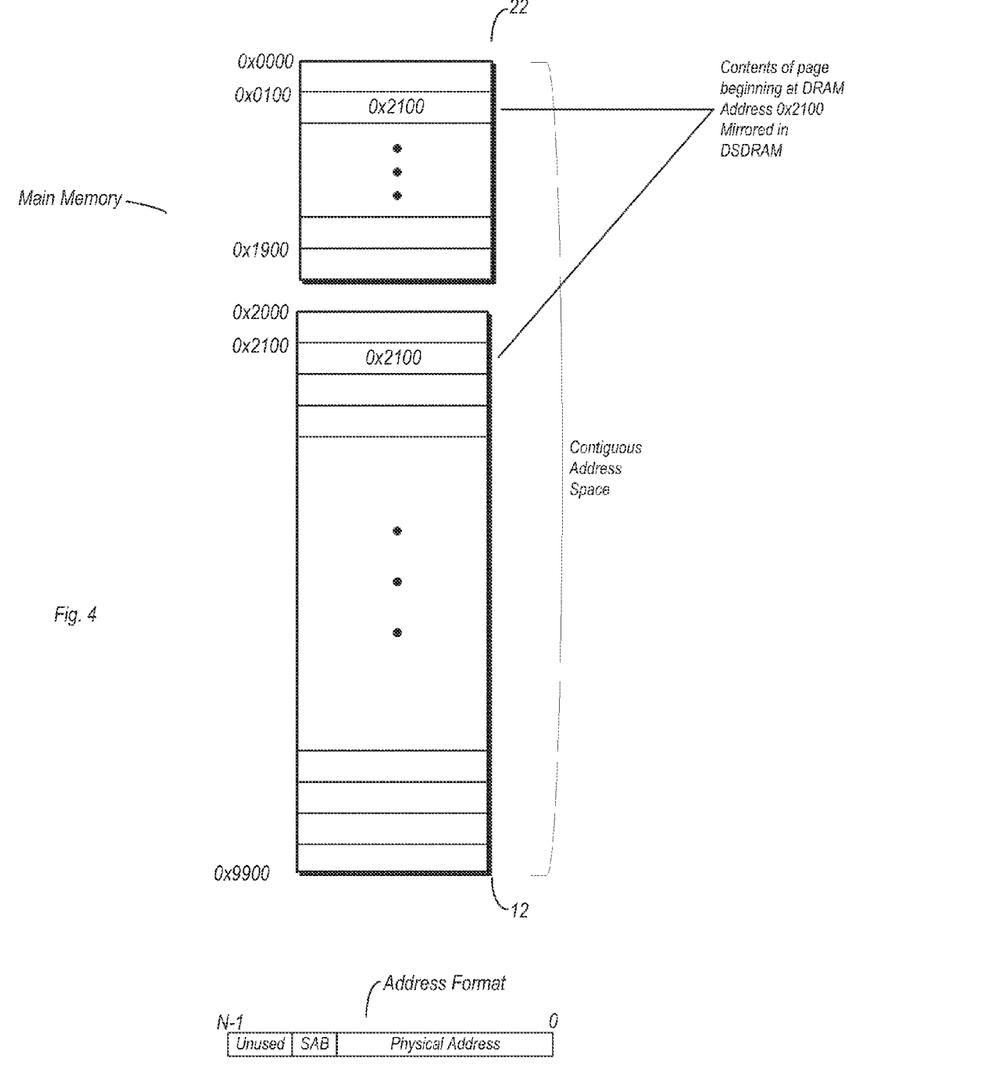
FIG. 4 is a diagram illustrating the address space of one embodiment of a main memory including a DRAM and a DSDRAM.

FIG. 4 is a diagram illustrating the address space of one embodiment of a main memory including a DRAM 12 and a DSDRAM 22. In the embodiment shown, storage locations in DSDRAM 22 occupy the first portion of the main memory address space. The main memory address space in the embodiment shown is a contiguous address space, with the last address of DSDRAM 22 being numerically adjacent to the first address 12. The storage locations of DRAM 12 occupy the second portion of the main memory address space. Page allocations to both DRAM 12 and DSDRAM 22 may be performed by OS 15 when executing on processor 24. OS 15 may access both MAT 32 and the RPT of RPT unit 34 as part of the process of determining page allocations.

In the exemplary embodiment shown, the contents of the page stored in the DRAM 12 the location beginning at address 0x2100 is mirrored (i.e., also stored) in the DSDRAM 22 in the location beginning at address 0x0100. Other pages stored in DRAM 12 may also be mirrored in DSDRAM 22. During computer system operation, OS 15 may attempt to mirror in the DSDRAM 22 the most frequently accessed pages stored in DRAM 12. This may in turn reduce memory access latency, reduce the penalty for cache misses, and thus increase performance.

FIG. 4 also illustrates the address format used in various embodiments of computer system 10. Each address includes N bits, from bit 0 to bit N−1. Most of the bits are dedicated to the actual physical address of the corresponding location, while some unused bits may also be present. This embodiment also includes a sync address bit (SAB) that, when set, indicates that a page is mirrored in DSDRAM 22. Accordingly, when an address is provided in a memory request, MMU 14 may forward the request directly to DRAM 12 if the SAB is not set. This may avoid an unnecessary table lookup in MAT 32. When the SAB is set, MAT 32 may be searched for the requested DRAM address to determine the corresponding DSDRAM address where the page is mirrored.

Figure 5:
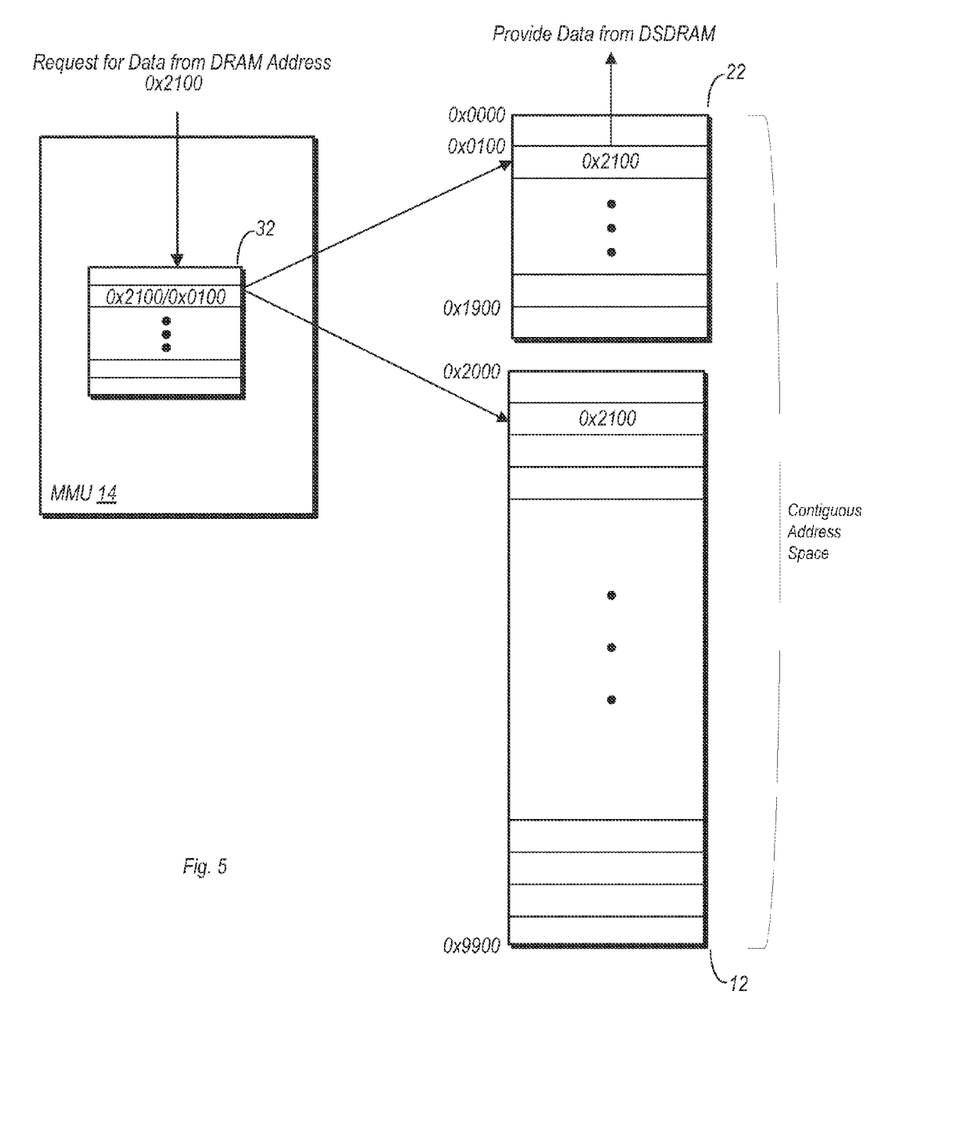
FIG. 5 is a block diagram illustrating the arrangement and operation of one embodiment of a mirror address table.

FIG. 5 is a block diagram illustrating the arrangement and operation of one embodiment of MAT 32. The illustrated example assumes that the SAB is set in the provided address, thus indicating that the requested page is stored in DSDRAM 22. The address is provided to MMU 14, and a lookup is performed in MAT 32. Then DRAM address 0x2100 is provided to MAT 32 to indicate the desired page. MAT 32 indicates that the page stored at DRAM address 0x2100 is mirrored in DSDRAM 22 at DSDRAM address 0x0100. Accordingly, the page is provided to processor 24 directly from DSDRAM 22.

It is noted that during a request involving a lookup of MAT 32, the requested DRAM address may also be provided to DRAM 12. This is due to the possibility that the page was recently evicted from DSDRAM 22 and the SAB in the corresponding DRAM address has not yet been reset. Thus, if this situation occurs, delays due to a table lookup may be avoided by providing the DRAM address of the requested page directly to DRAM 12 concurrently with providing it to MAT 32.

Figure 6:
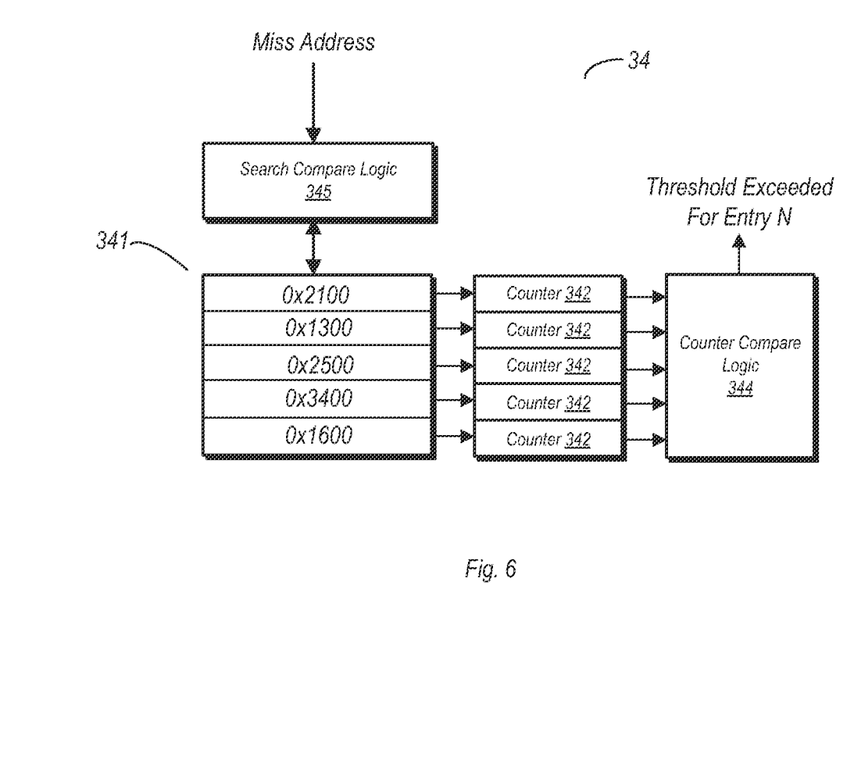
FIG. 6 is a block diagram illustrating the arrangement and operation of one embodiment of a reverse promotion table unit.

FIG. 6 is a block diagram illustrating the arrangement and operation of one embodiment of a reverse promotion table unit. In the embodiment shown RPT unit includes counter compare logic 344, RPT 341, a number of counters 342, and search compare logic 345. RPT 341 may store the addresses for DRAM pages that are considered "hot", but have not exceeded the threshold for being promoted into DSDRAM 22 (or in some cases, pages that have been recently evicted from DSDRAM 22). When a page is accessed from DRAM, the address may be provided to search compare logic 345. The search compare logic 345 may compare the received address (shown in the drawing as 'Miss Address'). If the received address matches an entry in RPT 341, a corresponding counter 342 is incremented, although the page corresponding to the address is not immediately reallocated to the DSDRAM 22. If the received address does not match an entry in RPT 341, another address may be evicted, and the received address may be loaded into the newly vacant entry.

Counter compare logic 344 in the embodiment shown is configured to compare the count values provided by each counter 342 to a threshold value. If the count value provided by any counter 342 exceeds a threshold value, counter compare logic 344 may assert a signal indicating that the threshold has been exceeded for the corresponding entry in RPT 341. Responsive thereto, OS 15 may reallocate the page at the DRAM address that is stored in the corresponding entry of RPT 341. Thus, RPT unit 34 may be used to determine which hot pages may be loaded into DSDRAM 22. Furthermore, RPT unit 34 may serve as a check on the eviction processes, allowing the re-promotion of pages that were erroneously evicted from DSDRAM 22, since subsequent accesses to recently evicted pages will result in their respective addresses being stored into RPT 341.

Although not shown here, RPT unit 34 may include additional logic to determine which entry of RPT 341 is purged when a new DRAM address is to be stored therein. For example, an additional counter indicating an amount of time that a given DRAM address has been stored in an entry of RPT 341. A decision on which entry to be purged from RPT 341 to make room for another DRAM address to be stored may be made on a combination of the amount of time the various entries have been present in RPT 341 and the number of accesses indicated by the counters 342. For example, an entry having the least number of accesses for a given amount of time above a certain threshold may be chosen to be evicted to make room for another DRAM address to be stored in RPT 341.

Figure 7:
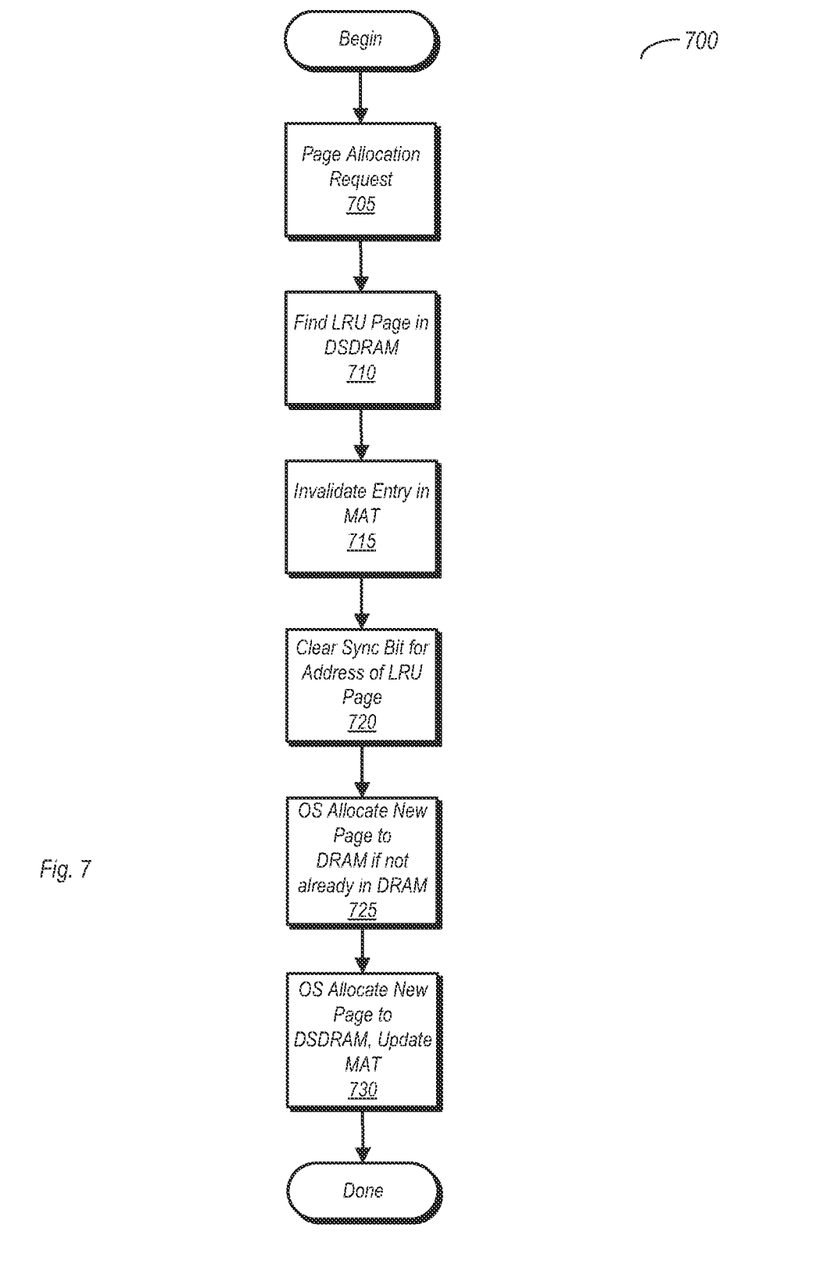
FIG. 7 is a flow diagram of a method for page allocation used in one embodiment of a memory subsystem.

FIG. 7 is a flow diagram of a method for page allocation used in one embodiment of a memory subsystem. Method 700 may be performed with various embodiments of the hardware discussed above. The performance of method 700 on hardware embodiments not explicitly disclosed herein is also possible and contemplated, and thus the disclosure is intended to include performance of the method on such hardware. It is further assumed that method 700 discussed herein begins at a point in time when DSDRAM 22 (or an equivalent thereof) is already populated with mirrored pages. During the initial populating of DSDRAM 22 (or equivalent), some portions of method 700 may be skipped.

Method 700 begins with a page allocation request (block 705), which may be triggered by a memory access request. Thereafter, the least recently used (LRU) page stored in the DSDRAM may be located (block 710). The MAT entry corresponding to the LRU page may then be invalidated (block 715), and the sync bit (SAB) for the DRAM address of the LRU page may be cleared (block 720). If the requested page was not already present in DRAM, the OS may also allocate the page thereto (block 725). Thereafter, the OS may allocate the new page to the DSDRAM and may also update the MAT (block 730). The SAB of the newly allocated page may also be set.

Figure 8:
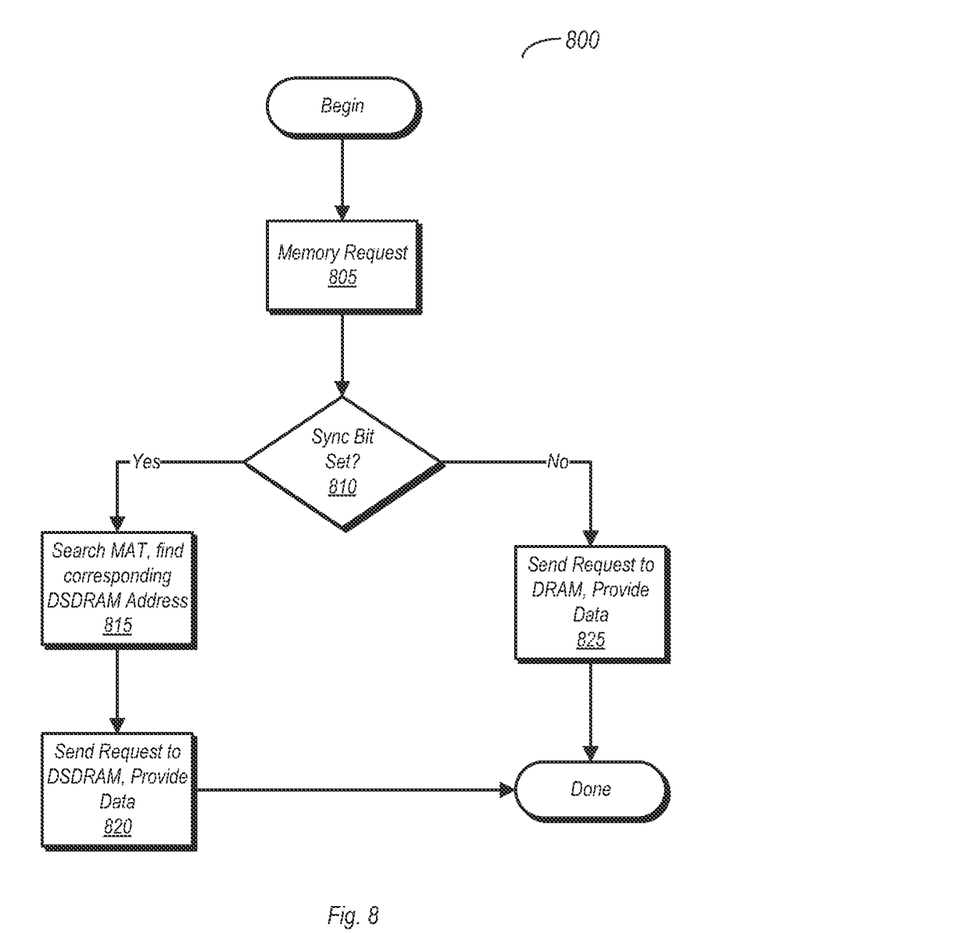
FIG. 8 is a flow diagram illustrating a method for handling a memory request in one embodiment of a memory subsystem.

FIG. 8 is a flow diagram illustrating a method for handling a memory request in one embodiment of a memory subsystem. Method 800 may be performed with the various hardware embodiments discussed above, although its performance on hardware embodiments not explicitly discussed herein is also possible and contemplated.

Method 800 begins with memory request being asserted by, e.g., a processor or processor core (block 805). An OS executing on the processor or a core thereof may determine if the sync (SAB) bit is set (block 810). If the sync bit is not set, indicating that the requested page is not a valid page stored in the DSDRAM (block 810, no), then the DRAM address of the requested page is sent directly to DRAM, and the data is provided if presently stored therein (block 825). If the sync bit is set (block 810), the DRAM address is sent to the MAT. A search of the MAT is conducted (block 815), and the corresponding DSDRAM address of the mirrored page is provided. The DSDRAM address is sent thereto, and the data stored in the mirrored page may be provided from the DSDRAM to the processor or processor core via a high speed dedicated interface.

Figure 9:
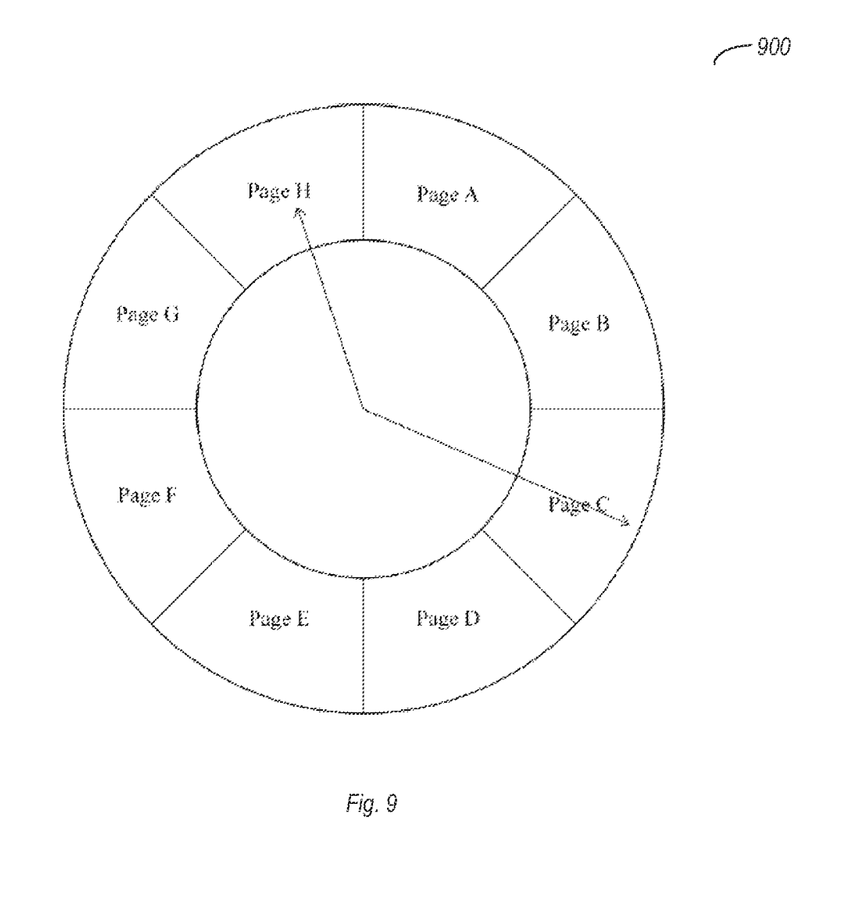
FIG. 9 is a diagram illustrating a least-recently used (LRU) algorithm for one embodiment of a memory subsystem including a DSDRAM.

FIG. 9 is a diagram illustrating a least-recently used (LRU) algorithm for one embodiment of a memory subsystem including a DSDRAM. The LRU algorithm may be used to determine which page is evicted from the DSDRAM when allocating a new page thereto. It is noted that other algorithms, LRU or otherwise, may be used to determine how pages are evicted from the DSDRAM, and thus the various hardware embodiments discussed herein and variations thereof are not limited to this particular algorithm.

Each entry in the MAT includes a reference bit that may be set when the corresponding page is accessed therefrom. The reference bits may be reset after a period of time has elapsed since the most recent access. The structure shown to illustrate LRU algorithm 900 includes two pointers that may scan the entries in the MAT. The structure is drawn in a clock shape to illustrate the operation. A first one of the pointers may traverse the entries of the MAT to find an entry in which the reference bit is not set. This page may be evicted. The second pointer periodically advances, clearing reference bits with each entry it advances. The advance of both pointers may be controlled by hardware. However, the advance of the first pointer may be triggered by the OS responsive to making the determination to allocate another page to the DSDRAM, necessitating the eviction of another page.

Numerous variations and modifications will become apparent to those skilled in the art once the above disclosure is fully appreciated. It is intended that the following claims be interpreted to embrace all such variations and modifications.

What is claimed is:

1. A computer system comprising:
a processor implemented on a silicon interposer of an integrated circuit (IC) package;
a die-stacked dynamic random access memory (DSDRAM) coupled to the processor, the DSDRAM implemented on the silicon interposer of the IC package;
a DRAM implemented separately from the IC package, wherein the DSDRAM and the DRAM form a main memory having a contiguous address space comprising a range of physical addresses, the physical addresses of the DSDRAM occupying a first portion of the contiguous address space and the DRAM occupying a second portion of the contiguous address space;
a storage unit storing instructions of an operating system (OS) executable on the processor, wherein the OS is configured to, upon initially allocating a page to the DRAM, also allocate the page to the DSDRAM; and
a memory controller having a reverse promotion table (RPT) configured to store DRAM addresses of pages stored in the DRAM;
wherein each physical address of the contiguous address space is augmented with a first bit that, when set, indicates that a page is stored in the DRAM and the DSDRAM; and
wherein responsive to a memory request to a page having a particular DRAM address, the OS is configured to cause a search of the RPT for the particular DRAM address responsive to determining that the first bit is not set for the particular DRAM address.

2. The computer system as recited in claim 1, wherein the OS is configured to cause the page at the particular DRAM address to be allocated to the RPT if the search of the RPT results in a miss.

3. The computer system as recited in claim 1, wherein each entry in the RPT is associated with a corresponding counter, wherein the corresponding counter of a given entry is configured to increment if a search for a DRAM address stored in that entry results in a hit.

4. The computer system as recited in claim 3, wherein the OS is configured to allocate a page to DSDRAM if a DRAM address corresponding to the page is stored in the RPT and a value indicated by the corresponding counter for that entry exceeds a predetermined threshold value.

5. The computer system as recited in claim 1, wherein the OS is configured to evict a least recently used page from the DSDRAM responsive to allocating a new page to the DSDRAM.

6. The computer system as recited in claim 1, wherein the DSDRAM comprises a plurality of memory chips arranged in a stacked configuration, wherein the plurality of memory chips are each electrically coupled to one or more through silicon vias.

7. The computer system as recited in claim 1, further comprising a memory controller having a mirror address table, wherein the mirror address table is configured to store DRAM addresses for pages that are also stored in the DSDRAM.

8. The computer system as recited in claim 7, wherein the memory controller is configured to provide a requested page stored at a corresponding DRAM address from the DSDRAM if the mirror address table is storing the corresponding DRAM address, and further configured to provide the requested page from the DRAM if the corresponding DRAM address is not stored in the mirror address table.

9. A system comprising:
a processor implemented on a silicon interposer of an integrated circuit (IC) package;
a die-stacked dynamic random access memory (DSDRAM) coupled to the processor by a dedicated interface, wherein the DSDRAM is implemented on the silicon interposer of the IC package, the IC package being coupled to a system board;
a DRAM implemented on the system board and separately from the IC package using one or more DRAM chips, wherein the DSDRAM and the DRAM form a main memory having a contiguous address space comprising a range of physical addresses, the physical addresses of the DSDRAM occupying a first portion of the contiguous address space and the DRAM occupying a second portion of the contiguous address space, and wherein each physical address of each page of the contiguous address space is augmented by a bit indicating whether the page is stored in the DSDRAM; and a memory controller coupled to the processor, the DRAM, and the DSDRAM, the memory controller including:

a reverse promotion table (RPT) configured to store DRAM addresses of pages stored in the DRAM and recently evicted from the DSDRAM, wherein responsive to a memory request to a page having a particular DRAM address, operating system (OS) software executing on the processor is configured to cause a search of the RPT for the particular DRAM address responsive to determining that the first bit is not set for the particular DRAM address; and a mirror address table, wherein the mirror address table is configured to store DRAM addresses for pages that are also stored in the DSDRAM, wherein the processor is configured to receive a requested page from the DSDRAM via the dedicated interface responsive to a determination that a DRAM address corresponding to the requested page is stored in the mirror address table.

10. A method comprising:

executing, on a processor of a computer system, instructions of an operating system (OS), wherein executing the instructions of the OS comprises:

storing memory pages determined to be infrequently accessed in a first portion of an address space of a system memory in a computer system, the address space comprising a contiguous range of addresses; and storing memory pages determined to be frequently accessed in both the first portion and a second portion of the address space, wherein the first portion of the address space is implemented in one or more dynamic random access memory (DRAM) chips separate from an integrated circuit (IC) package that includes the processor, and wherein the second portion of the address space is implemented on a silicon substrate of the IC package using a die-stacked DRAM (DS-DRAM);

wherein each physical address of the contiguous address space is augmented with a first bit that, when set, indicates that a page is stored in the DRAM and the DSDRAM;

wherein executing instructions of the OS further comprises:

the OS initially allocating a page to the DRAM; and
the OS allocating the page to DSDRAM concurrent with initially allocating the page to DSDRAM
cause a search of a reverse promotion table for a DRAM address of a page recently evicted from the DSDRAM responsive to determining, during a memory request for the page specified by the DRAM address, that the first bit is not set.

11. The method as recited in claim 10, further comprising the processor executing instructions of the OS to cause allocating of the page specified by the DRAM address to the DSDRAM responsive to the search of the reverse promotion table resulting in a miss.

12. The method as recited in claim 10, further comprising:
the processor executing instructions of the OS to cause a counter to increment responsive to a hit during the search of the reverse promotion table, the counter being associated with a storage location in the reverse promotion table storing the DRAM address of the page recently evicted from the DSDRAM; and
the processor executing instructions of the OS to cause allocation to DSDRAM of a page associated with an address stored in the reverse promotion table responsive to determining that a count value of a counter associated with a corresponding storage location exceeds a threshold value.

13. The method as recited in claim 10, further comprising the processor executing instructions of the OS to cause a least recently used page to be evicted from the DSDRAM responsive to allocating a new page to the DSDRAM.

14. The method as recited in claim 10, further comprising:
a memory controller storing, in a mirror allocation table, address information for pages allocated in the DRAM that are also allocated to the DSDRAM; and
providing a page from the DSDRAM to a requestor responsive to a request for the page when its corresponding address information stored in the mirror allocation table; and
providing the page from the DRAM to the requestor responsive to a request for the page when its corresponding address information is not stored in the mirror address table.

15. The method as recited in claim 10, wherein the DSDRAM comprises a plurality of memory chips arranged in a stacked configuration, wherein the plurality of memory chips are each electrically coupled to one or more through silicon vias.

* * * * *